United States Patent [19]

Zobel et al.

[11] 4,377,790
[45] Mar. 22, 1983

[54] PRECISION DIFFERENTIAL RELAXATION OSCILLATOR CIRCUIT

[75] Inventors: Don W. Zobel; W. David Pace, both of Tempe, Ariz.

[73] Assignee: Motorola, Inc., Schaumburg, Ill.

[21] Appl. No.: 298,126

[22] Filed: Aug. 31, 1981

[51] Int. Cl.³ .............................................. H03K 4/50
[52] U.S. Cl. ................................. 331/111; 331/108 D
[58] Field of Search ..................... 331/111, 108 D, 143

[56] References Cited

U.S. PATENT DOCUMENTS

| | | | |
|---|---|---|---|
| 3,742,384 | 6/1973 | Breitzmann et al. | 331/108 D X |
| 3,831,113 | 8/1974 | Ahmed | 331/111 |
| 3,904,988 | 9/1975 | Hsiao | 3331/111 |
| 4,205,279 | 5/1980 | Beutler | 331/108 D X |

*Primary Examiner*—Siegfried H. Grimm
*Assistant Examiner*—Edward P. Westin
*Attorney, Agent, or Firm*—Michael D. Bingham

[57] ABSTRACT

A relaxation oscillator which is suited for fabrication as a monolithic circuit and which uses a parallel resistive capacitive frequency determining network wherein a capacitor is charged and discharged between an upper and lower voltage level. As the capacitor is charged to a potential exceeding a first threshold voltage level supplied to a comparator switch, the operating state of the comparator is caused to switch. A current detecting circuit is included which detects a current that is proportional to the charging current supplied to the capacitor from a charge circuit. As the proportional current decreases in value below a predetermined level due to the capacitor being charged to the upper voltage level the current detecting circuit is disabled which actuates a control circuit for switching the threshold voltage applied to the comparator to a lower level. The actuated control circuit also disables the charge circuit such that the capacitor discharges to the lower voltage level at which time the comparator switches states to disable the control circuit whereby the threshold voltage level is switched to the first level. Thereafter, the charge circuit is enabled to enable the current detecting circuit and to charge the capacitor to the upper voltage level.

14 Claims, 3 Drawing Figures

PRECISION DIFFERENTIAL RELAXATION OSCILLATOR CIRCUIT

BACKGROUND OF THE INVENTION

1. Field of the Invention

This invention relates to relaxation type oscillators incorporating resistive and capacitive elements (RC) and, more particularly, to a RC relaxation type oscillator circuits suitable to be fabricated in integrated circuit form to which a resistive and capacitive frequency determining network is coupled thereto at a single external pin of the oscillator, and wherein the frequency of oscillation is made substantially independent to process and temperature variations in the integrated oscillator circuit.

2. Description of the Prior Art

Relaxation oscillators which generally rely on resistive-capacitive frequency determining networks are utilized in many applications including timing circuits in data transmission systems, sweep oscillators, television receivers, reference oscillators in decoders for stereo FM radio receivers, telephone ringers and telecommunication systems, and the like. Moreover, differential relaxation oscillators that are suited to be fabricated in integrated circuit form are known in the art. For example, U.S. Pat. Nos. 3,688,220 and 3,824,494 disclose such oscillators wherein a sawtooth oscillation signal is generated having a frequency of oscillation determined by the RC frequency determining network.

As disclosed in the prior art relaxation oscillators are found in many different forms but generally are quite sensitive to supply voltage variations, temperature variations and the charge rate at which the capacitive element is charged and discharged which determines the oscillator frequency period. In one favored form the prior art relaxation oscillators comprise a differential comparator amplifier which has a reference voltage applied to one input thereof and the frequency determining network coupled to the other input. In general operation of this type of relaxation oscillator the capacitive element of the frequency determining network is charged at some rate until such a time that the voltage developed thereacross exceeds the trip point of the comparator at which time the capacitor is then caused to be discharged through the resistive element of the frequency determining network. One of the main problems that arise in some of the prior art integrated circuit relaxation oscillators including a comparator amplifier is due to the inaccuracies associated with the charging rate of the capacitor, i.e., the percentage of the oscillation time period that is required to charge the capacitor to its peak value. How accurately the capacitor is charged also affects the precision of the oscillation frequency. For instance, if the rate of charge of the capacitor is too slow the accuracies of the oscillator circuit are degenerated since the rate of charge then becomes a function of the devices of the integrated circuit, i.e., the rate will depend on the beta amplification factors of the transistor as well as the junction resistances thereof which vary both with temperature and process variations. Hence, the frequency of oscillation will also vary. If the rate of charge of the capacitor is too fast, the response time of the comparator amplifier becomes critical. The desired charge on the capacitor can be exceeded if the differential amplifier cannot switch at the exact moment the voltage across the capacitor exceeds the reference voltage level as aforedescribed. This causes overshoot of the desired peak voltage across the capacitor which affects the operating frequency of the oscillator. Therefore, due to these errors, it has been very difficult, if not impossible, to fabricate precision differential relaxation oscillators in integrated circuit form.

Thus, a need for a precision relaxation oscillator suited for fabricated in integrated circuit form having an accuracy of ±5% of the desired operating frequency using 1% standard external components arises.

SUMMARY OF THE INVENTION

Accordingly, it is an object of the present invention to provide an improved differential relaxation oscillator circuit.

It is another object of this invention to provide an improved differential relaxation oscillator circuit the operating characteristics of which are substantially independent to temperature and process variations.

In accordance with the foregoing and other objects there is provided an oscillator circuit having a parallel RC timing circuit connected between a point of reference potential and one input of a comparator amplifier, the other input of which is coupled to a fixed reference potential to establish a trip point or switching level for the comparator. A current source charges the capacitive element of the RC timing network towards an upper peak voltage level. The comparator amplifier switches to a second operating state from a first operating state as the voltage across the capacitor exceeds the fixed reference potential which switching occurs prior to the capacitive element being charged to its peak voltage level. A current which is proportional to the charging current supplied to the capacitive element is detected by a detecting circuit which disables a reference potential control circuit while the capacitive element is being charged. As the capacitive element is charged to its peak value the detecting circuit enables the control circuit which is coupled between the other input of the comparator amplifier and the point of reference potential thereby reducing the potential at the other input of the comparator amplifier. Simultaneously, the control circuit disables the current source wherein a capacitive element is allowed to be discharged toward the reduced reference potential level supplied at the other input of the comparator amplifier. Thereafter, the comparator amplifier switches to its first operating state thereby disabling the control circuit such that the current source is then enabled to source current to cause charging of the capacitive element.

By switching the operating states of the comparator amplifier well in advance of the capacitive element being charged to its peak voltage value, the speed of the comparator amplifier is not critical to the operation of the oscillator since the comparator amplifier does not determine the point at which charging of the capacitor ceases and discharging thereof begins. Rather, the current detecting circuit which senses the capacitive element current and which is disabled when the capacitor is charged to its peak voltage value to cause reduction of the bias potential supplied to the comparator amplifier determines the point at which the capacitive element is allowed to be discharged by disabling the current source via the control circuit. Thus, the capacitive element can be quickly charged which eliminates inaccuracies due to temperature and circuit fabrication process variations. Moreover, overshoot problems which produce inaccuracies in the frequency of oscillation are avoided.

DETAILED DESCRIPTION OF THE PREFERRED EMBODIMENT

Figure 1:
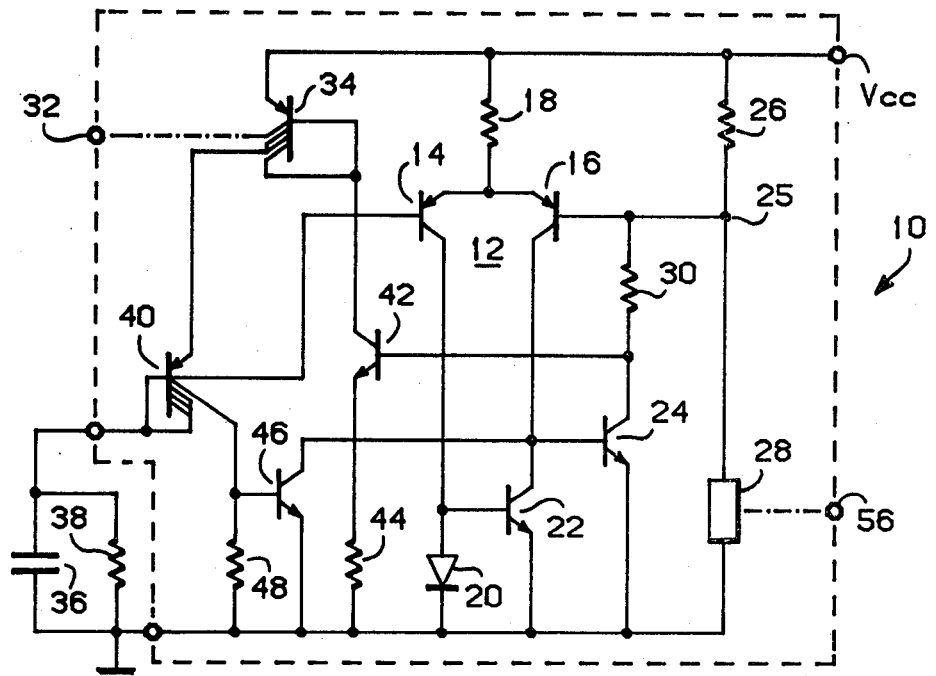
FIG. 1 is a schematic diagram illustrating the oscillator of the preferred embodiment.
Figure 2:
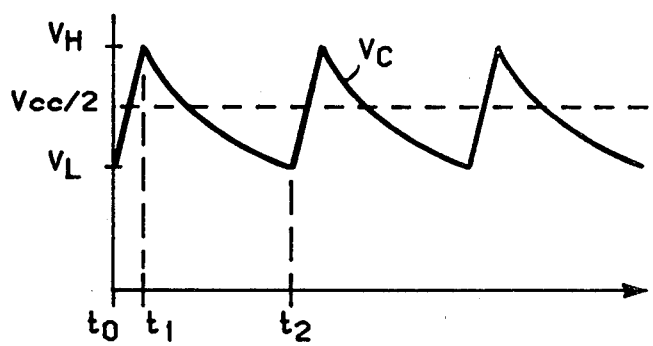
FIG. 2 illustrates waveforms useful in understanding the operation of the oscillator circuit of FIG. 1.

Turning to FIGS. 1 and 2 differential relaxation oscillator 10 of the present invention is now fully described. As indicated by being enclosed within the dashed box, oscillator 10 is suited to be fabricated in integrated form and is coupled between a source of operating potential $V_{CC}$ and ground reference. Oscillator 10 comprises a differential comparator amplifier 12 which includes PNP transistors 14 and 16 differentially coupled at their emitters to $V_{CC}$ via resistor 18. The collectors of transistors 14 and 16 are connected to a differential to single ended converter circuit comprising diode 20 and transistor 22. The differential to single ended converter circuit is well understood to those skilled in the art and provides an output from comparator 12 at the base of transistor 24. Diode 20 may be constructed by utilizing a diode connected transistor as is known. The base of transistor 16 serves as one input of comparator 12 which receives a fixed reference potential thereat that appears at the node 25 intersecting series connected resistor 26 and element 28. In one embodiment of the invention element 28 is a resistor having a substantially equal value as resistor 26 which thereby sets the trip point of comparator 12 at $V_{CC}/2$. The output of comparator 12 is returned to the base of transistor 16 through the base to collector path of transistor 24, which has its collector-emitter path coupled between one side of resistor 30 to ground reference. The other side of resistor 30 is returned to the base of transistor 16. As will be later explained, if a resistor is used for element 28 as described above, the output of oscillator 10 is taken at node 32; at one of the collectors of multi-collector PNP transistor 34. The other input of comparator 12 is connected at the base of transistor 14 and is connected to a frequency determining network comprising capacitor 36 and resistor 38 which may be elements external to the integrated circuit. The other side of the frequency determining network is connected to ground reference.

A path for current to charge capacitor 36 is supplied through PNP multi-collector transistors 34 and 40 each of which, as shown, has the base thereof coupled to at least one of the collectors thereof with the collector of transistor 40 being connected to capacitor 36 and resistor 38. It is understood that transistor 34 need not have one collector returned to its base for the oscillator 10 to operate properly. Transistor 42, having its collector-emitter path coupled between the base of transistor 34 and ground reference via resistor 44 renders transistor 34 conductive when transistor 24 is non-conductive such that current is supplied from transistor 34 to charge capacitor 36. Base current drive to transistor 42 is supplied via resistor 30. Transistor 46 which has its base coupled to a collector of transistor 40 and via resistor 48 to ground reference detects the current flow in capacitor 36 as will be explained. The collector-emitter path of transistor 46 is connected between the output of comparator 12, to the base of transistor 24 and ground reference.

In operation, as illustrated in FIG. 2, capacitor 36 is charged and then discharged whereby the voltage $V_C$ developed thereacross is generally sawtooth shaped. If it is assumed that at $t_0$ capacitor 36 has been discharged to its lower threshold voltage level $V_L$, comparator 12 will be switched to a first operating state such that transistor 24 is rendered non-conductive since transistor 22 sinks all of the current supplied from the output of the comparator. Hence, a fixed reference potential equal to substantially $V_{CC}/2$ is supplied at the base of transistor 16 at node 25. Thus, the trip point or switching level of comparator 12 is set at an upper threshold level equal to $V_{CC}/2$.

In response to the comparator switching to its first operating state, transistor 42 is rendered conductive to turn on transistor 34 which in turn sources current via transistor 40 to charge capacitor 36. Simultaneously, a current proportional to the capacitor charging current is supplied from the collector of transistor 40 that is coupled to resistor 48 to forward bias current detecting transistor 46. As long as the charging current is sufficient to maintain transistor 46 forward biased, transistor 24 cannot be rendered conductive. Although any ratio can be maintained between the charging current and the detected current, as indicated, the current detected by transistor 46 is equal to one-fourth of the magnitude of the charging current supplied to capacitor 36.

Prior to $t_1$, when the voltage developed across capacitor 36 exceeds $V_{CC}/2$ as the capacitor is charged, comparator 12 switches operating states whereby transistor 22 is turned off. However, transistor 24 is maintained in a non-conductive state as transistor 46 sinks the current supplied from the output of comparator 12. At $t_1$, capacitor 36 is charged to its upper voltage level $V_H$. As the voltage developed across capacitor 36 approaches $V_H$, transistor 34 becomes saturated which reduces the magnitude of the current supplied therefrom through transistor 40 to the capacitor and to the base of transistor 46. As the current supplied to the base of transistor 46 decreases below a predetermined level conduction of transistor 46 can no longer be sustained and the transistor is rendered non-conductive as $V_C$ becomes equal to $V_H$. In response to transistor 46 becoming non-conductive, transistor 24 is no longer disabled and is turned on by the current supplied at the output of comparator 12 to the base thereof.

When transistor 24 is rendered conductive, transistor 42 is disabled thereby rendering the current source comprising transistor 42, as well as transistors 34 and 40 non-conductive. Hence, capacitor 36 begins discharging through resistor 38. Concurrently, resistor 30 is placed in parallel with element 28 as transistor 24 becomes conductive to lower the reference potential supplied at the base of transistor 16. Thus, the switching level of comparator 12 is reduced to a value corresponding to $V_L$. This allows capacitor 36 to be discharged to this potential. When the voltage across capacitor 36 decreases to $V_L$, at time $t_2$, comparator 24 switches states causing transistor 24 to become non-conductive. Transistor 42 is then no longer disabled and current is again sourced to capacitor 36 thereby charging the capacitor. Simultaneously, the reference potential supplied at the one input of comparator 12 that appears at node 25 is returned to its higher value, $V_{CC}/2$, and operation of the circuit is repeated. As indicated, an output may be taken at node 32 of the oscillator circuit.

Figure 3:
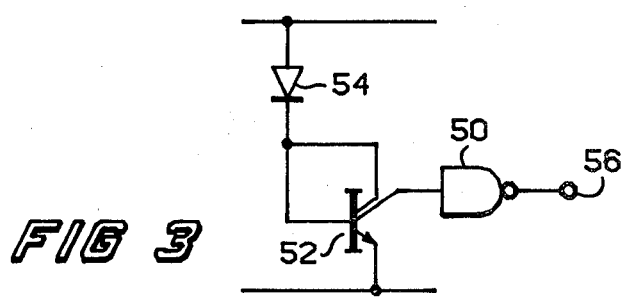
FIG. 3 is a schematic diagram illustrating a bias potential producing an output gate circuit that can be utilized in the oscillator of the present invention.

Referring now to FIG. 3, element 28 may be comprised of a NAND gate 50, the input of which is coupled at a collector of diode connected transistor 52. Multicollector connected transistor 52 is connected in series with diode 54 between node 25 and ground reference. Transistor 52 and NAND gate 50 may be formed using known integrated injection logic circuit techniques to provide a buffered output at node 56. For example, setting $V_{CC}$ equal to 4 $V_{be}$, where $V_{be}$ is the voltage drop across a standard diode, the trip point of comparator 12 is maintained at $V_{CC}/2$.

A significant aspect of the present invention is that operation of the oscillator circuit is made substantially independent to the switching speed of comparator 12 by setting the upper switching point, for instance, midway between the upper and lower peak voltage levels that capacitor 36 is charged and discharged between. Thus, capacitor 36 can be charged at a fast rate to eliminate inaccuracies due to temperature and device process variations while inaccuracies due to slow comparator switching times are eliminated.

Another significant aspect of the present invention relates to detecting a current proportional to the capacitor charging current to cause the capacitor to be discharged when this charging current decreases below a predetermined value. Hence, discharge of the capacitor cannot occur until the comparator has switched from a first operating state to a second operating state "AND" the charging current decreases below a predetermined value. Thus, detecting transistor 46 and transistor 22 act as a wired AND gate to prevent transistor 24 from disabling the current source until capacitor 36 is charged to its upper peak voltage level.

We claim:

1. An oscillator, comprising:
   frequency determining means including charge storage means;
   comparator means having first and second inputs and an output, said first input receiving a threshold determining voltage, said second input being coupled to said frequency determining means, said comparator means switching between first and second operating states as the voltage across said charge storage means exceeds a first threshold voltage for providing a control signal at said output;
   switchable threshold voltage circuit means operatively coupled between said output and first input of said comparator means which when enabled is responsive to said control signal for switching said threshold determining voltage from said first threshold voltage to a second threshold voltage;
   charge circuit means operatively coupled to said switchable threshold voltage circuit means for supplying a charging current to said charge storage means when enabled by said switchable threshold voltage circuit means being disabled;
   current detecting means operatively connected between said charge circuit means and said output of said comparator means, said current detecting means detecting a current proportional to said charging current for disabling said switchable threshold voltage circuit means whenever said charging current is greater than a predetermined value, said current detecting means being disabled whenever said charging current becomes less than said predetermined value for enabling said switchable threshold voltage circuit means so that said charge circuit means is disabled to allow said charge storage means to discharge to said second threshold voltage level.

2. The oscillator of claim 1 wherein said current detecting means includes a first transistor having first and second main electrodes and a control electrode, said first main electrode being coupled to a first terminal at which is supplied a reference potential, said control electrode being coupled to said charge circuit means, said second main electrode being coupled to said output of said comparator means, and first resistive means coupled between said control electrode and said first terminal.

3. The oscillator of claim 2 wherein said switchable threshold voltage circuit means includes:
   first circuit means for producing a fixed reference potential at an output thereof, said output being coupled to said first input of said comparator means, said fixed reference potential being said first threshold voltage; and
   a second transistor having first and second main electrodes and a control electrode, said first main electrode being coupled to said first terminal, said second main electrode being coupled to said first input of said comparator means, said control electrode being connected to said output of said comparator means.

4. The oscillator of claim 3 wherein said switchable threshold voltage circuit means further includes:
   second resistive means connected between said first input of said comparator means and said second main electrode of said second transistor; and
   said first circuit means including third and fourth serially connected resistive means coupled between a source of operating potential supplied to the oscillator and said first terminal, the interconnection point between said first and second resistive means coupled to said first input of said comparator means.

5. The oscillator of claims 3 or 4 wherein said charge circuit means includes:
   a third transistor having first and second main electrodes and a control electrode, said control electrode being coupled to said second main electrode of said second transistor, said first main electrode being coupled to said first terminal;
   a fourth transistor having at least first, second and third main electrodes and a control electrode, said first main electrode being adapted to receive said source of operating potential, said second main electrode being connected to said control electrode and to said second main electrode of said third transistor;
   a fifth transistor having at least first, second and third main electrodes and a control electrode, said first main electrode being coupled to said third main electrode of said fourth transistor, said second main electrode being coupled to said control electrode of said first transistor, said third main electrode being coupled to said control electrode and to said frequency determining means; and
   first additional resistive means coupled between said first main electrode of said third transistor and said first terminal.

6. The oscillator of claim 5 wherein said frequency determining means includes:

said charge storage means being a capacitor connected between said third main electrode of said fifth transistor and said first terminal; and second additional resistive means coupled between said third main electrode of said fifth transistor and said first terminal.

7. The oscillator of claim 6 wherein said fourth transistor includes a fourth main electrode which is an output of the oscillator.

8. A relaxation type oscillator suitable to be fabricated in monolithic integrated circuit form, comprising:

frequency determining means including charge storage means, said frequency determining means being external to the oscillator and being coupled to an external terminal thereto;

comparator means having first and second inputs and an output, said first input receiving a threshold determining voltage, said second input being coupled to said frequency determining means, said comparator means switching between first and second operating states as the voltage across said charge storage means exceeds a first threshold voltage for providing a control signal at said output;

switchable threshold voltage circuit means operatively coupled between said output and first input of said comparator means which when enabled is responsive to said control signal for switching said threshold determining voltage from said first threshold voltage to a second threshold voltage;

charge circuit means operatively coupled to said switchable threshold voltage circuit means for supplying a charging current to said charge storage means when enabled by said switchable threshold voltage circuit means being disabled;

current detecting means operatively connected between said charge circuit means and said output of said comparator means, said current detecting means detecting a current proportional to said charging current for disabling said switchable threshold voltage circuit means whenever said charging current is greater than a predetermined value, said current detecting means being disabled whenever said charging current becomes less than said predetermined value for enabling said switchable threshold voltage circuit means so that said charge circuit means is disabled to allow said charge storage means to discharge to said second threshold voltage level.

9. The oscillator of claim 8 wherein said current detecting means includes a first transistor having first and second main electrodes and a control electrode, said first main electrode being coupled to a first terminal at which is supplied a reference potential, said control electrode being coupled to said charge circuit means, said second main electrode being coupled to said output of said comparator means, and first resistive means coupled between said control electrode and said first terminal.

10. The oscillator of claim 9 wherein said switchable threshold voltage circuit means includes:

first circuit means for producing a fixed reference potential at an output thereof, said output being coupled to said first input of said comparator means, said fixed reference potential being said first threshold voltage; and a second transistor having first and second main electrodes and a control electrode, said first main electrode being coupled to said first terminal, said second main electrode being coupled to said first input of said comparator means, said control electrode being connected to said output of said comparator means.

11. The oscillator of claim 10 wherein said switchable threshold voltage circuit means further includes:

second resistive means connected between said first input of said comparator means and said second main electrode of said second transistor; and said first circuit means including third and fourth serially connected resistive means coupled between a source of operating potential supplied to the oscillator and said first terminal, the interconnection point between said first and second resistive means coupled to said first input of said comparator means.

12. The oscillator of claim 10 or 11 wherein said charge circuit means includes:

a third transistor having first and second main electrodes and a control electrode, said control electrode being coupled to said second main electrode of said second transistor, said first main electrode being coupled to said first terminal;

a fourth transistor having at least first, second and third main electrodes and a control electrode, said first main electrode being adapted to receive said source of operating potential, said second main electrode being connected to said control electrode and to said second main electrode of said third transistor; and a fifth transistor having at least first, second and third main electrodes and a control electrode, said first main electrode being coupled to said third main electrode of said fourth transistor, said second main electrode being coupled to said control electrode of said first transistor, said third main electrode being coupled to said control electrode and to said frequency determining means.

13. The oscillator of claim 12 wherein said frequency determining means includes:

said charge storage means being a capacitor connected between said third main electrode of said fifth transistor and said first terminal; and additional resistive means coupled between said third main electrode of said fifth transistor and said first terminal.

14. The oscillator of claim 13 wherein said fourth transistor includes a fourth main electrode which is connected to an output of the oscillator.

* * * * *